(12) United States Patent
Bidermann et al.

(10) Patent No.: US 6,737,626 B1
(45) Date of Patent: May 18, 2004

(54) IMAGE SENSORS WITH UNDERLYING AND LATERAL INSULATOR STRUCTURES

(75) Inventors: William R. Bidermann, Los Gatos, CA (US); Ricardo J. Motta, Palo Alto, CA (US)

(73) Assignee: PiXIM, Inc., Mountain View, CA (US)

( * ) Notice: Subject to any disclaimer, the term of this patent is extended or adjusted under 35 U.S.C. 154(b) by 149 days.

(21) Appl. No.: 09/923,274

(22) Filed: Aug. 6, 2001

(51) Int. Cl.$^7$ .............................................. H01L 27/00
(52) U.S. Cl. .................. 250/208.1; 250/214.1
(58) Field of Search ..................... 250/208.1, 214.1, 250/214 R; 257/290, 292, 294, 297, 305; 348/294, 308

(56) References Cited

U.S. PATENT DOCUMENTS

| | | | | |
|---|---|---|---|---|
| 5,282,041 A | * | 1/1994 | Tani et al. ................... | 348/299 |
| 5,323,052 A | * | 6/1994 | Koyama ................... | 250/208.1 |
| 6,001,667 A | * | 12/1999 | Saitoh et al. ................. | 438/57 |
| 6,034,725 A | * | 3/2000 | Franklin et al. ............ | 348/310 |

FOREIGN PATENT DOCUMENTS

JP          11-284169       * 10/1999

* cited by examiner

Primary Examiner—Thanh X. Luu
(74) Attorney, Agent, or Firm—Steve Mendelsohn; Yuri Gruzdkov; Joe Zheng

(57) ABSTRACT

An integrated image sensor having a conditioned top silicon oxide layer and/or one or more additional insulating layers/structures to reduce optical and/or electrical noise. The image sensor has an array of one or more pixels, each pixel having a photoelement formed on a substrate and configured to generate an electrical signal in response to incident light, and associated circuitry formed on the substrate and configured to process the electrical signal generated in the photoelement. In one embodiment, a portion of a top insulating layer in the integrated image sensor corresponding to each photoelement has a thickness different from the thickness of a portion of the top insulating layer corresponding to its associated circuitry to inhibit the flow of light between the associated circuitry and the photoelement and/or between the pixel and an adjacent pixel in the array. In another embodiment, the image sensor has one or more insulating structures formed on the substrate and configured to inhibit the flow of electricity between a photoelement and its associated circuitry and/or the pixel and an adjacent pixel in the array. The present invention can reduce optical and/or electrical noise and crosstalk to improve image quality and diminish artifacts in the image sensor's output.

24 Claims, 6 Drawing Sheets

102

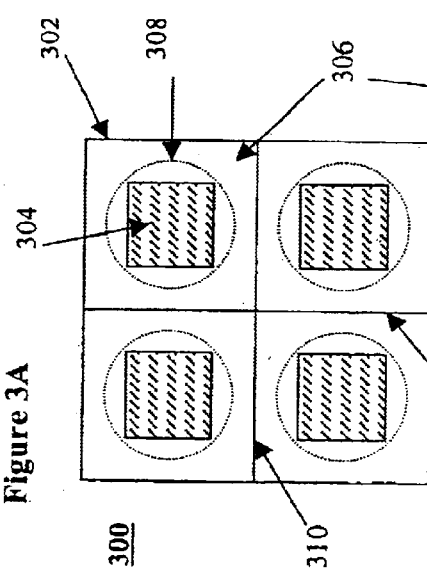
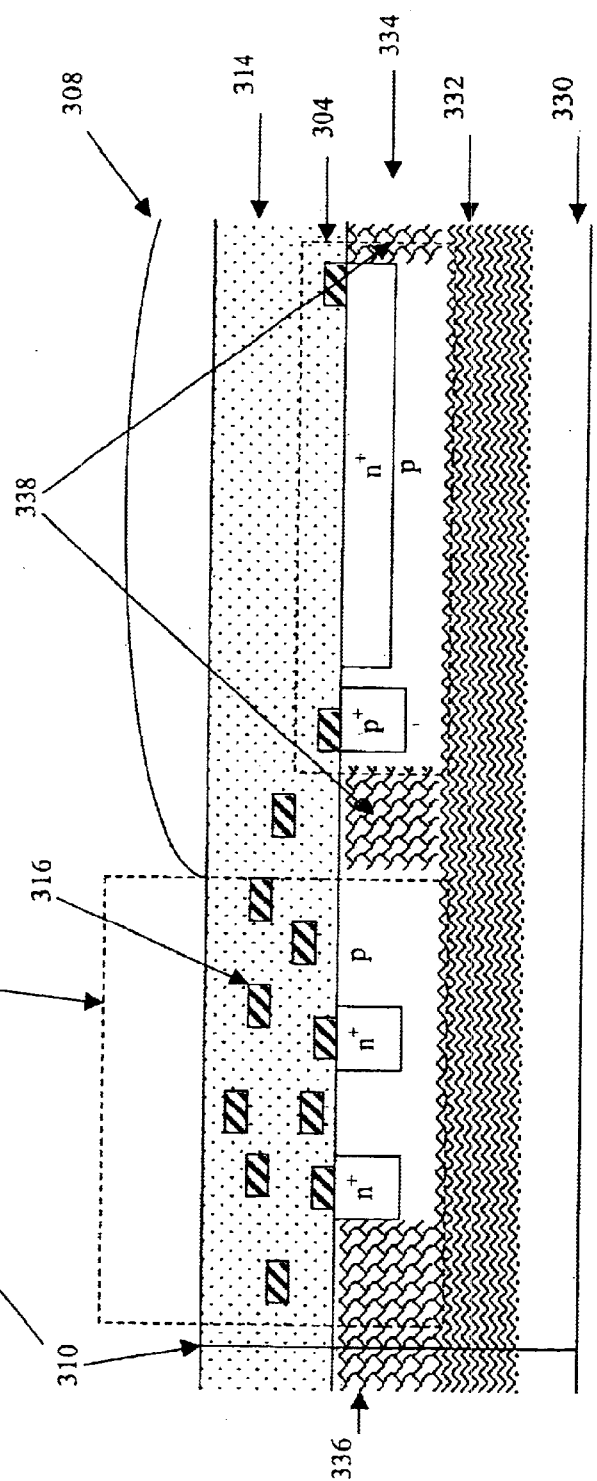
Figure 3A
Figure 3B

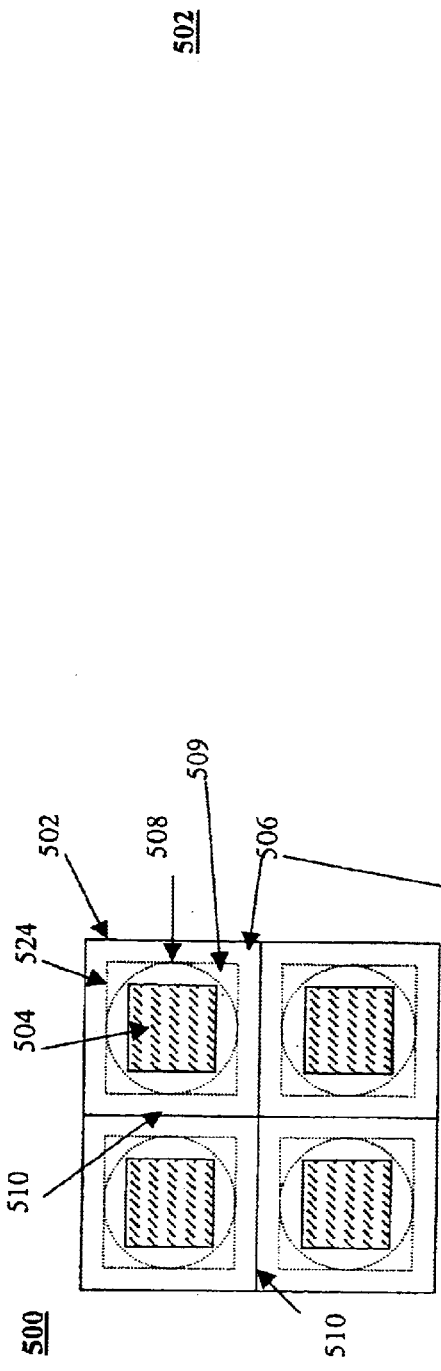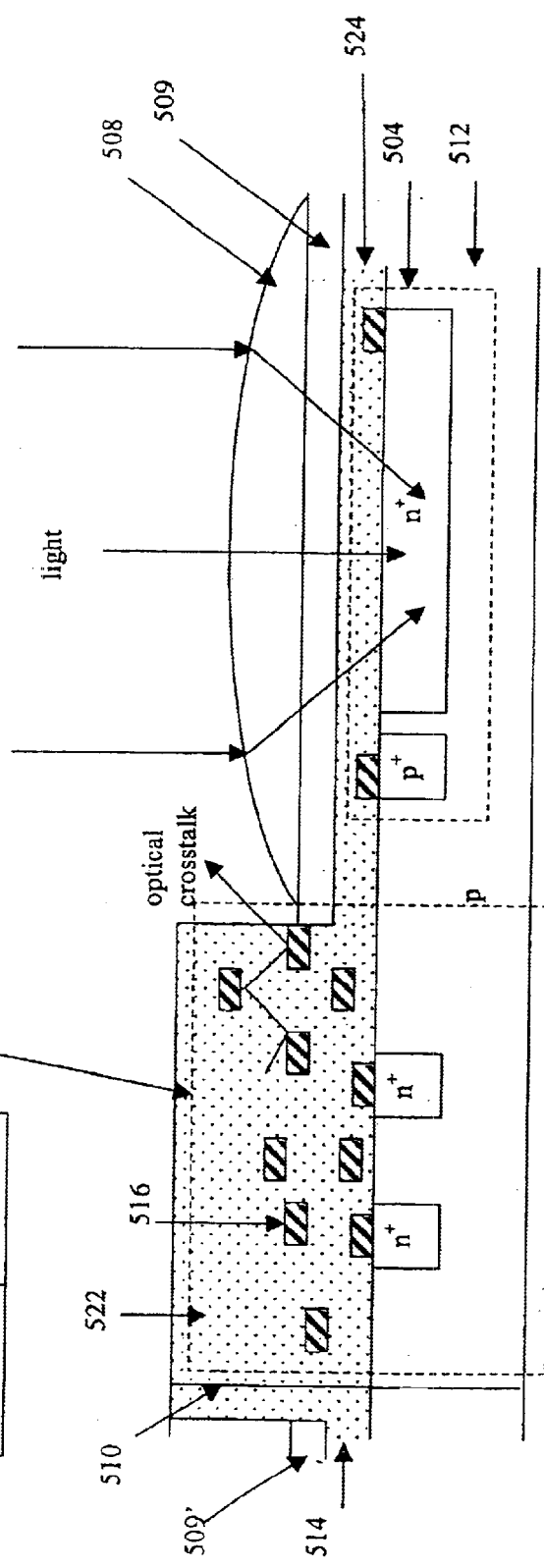
Figure 5A
Figure 5B

IMAGE SENSORS WITH UNDERLYING AND LATERAL INSULATOR STRUCTURES

BACKGROUND OF THE INVENTION

1. Field of the Invention

The present invention relates to the field of integrated image sensors.

2. Description of the Related Art

An integrated image sensor is used to convert light impinging on the sensor into electrical signals. An image sensor typically includes one or more (e.g., an array of) photoelements such as photodiodes, phototransistors, or other types of photodetectors, where electrical signals are generated via the well-known photoelectric effect. These signals may then be used, for example, to provide information about light intensity, color, or the optical image focused on the sensor. One common type of image sensor is a CMOS image sensor.

FIG. 1 shows a schematic top view of a conventional CMOS image sensor 100 implemented in a single integrated circuit or chip. Sensor 100 comprises a photoelement array 102, a decoding(buffer area 104, and control, processing, and input(output (I/O) circuitry 106. Photoelement array 102 comprises an array of photoelements and associated circuitry such as switches and amplifiers. Each photoelement and its associated circuitry are collectively referred to as a pixel.

FIG. 2A shows a schematic top view of part of integrated CMOS image sensor 100 of FIG. 1. In particular, FIG. 2A depicts a representative 2×2 region of individual pixels 202 of photoelement array 102 of FIG. 1. Each pixel 202 comprises a photoelement 204, its associated circuitry 206, an optional microlens 208, and an optional color filter 209. Individual pixels are separated by pixel boundaries 210.

FIG. 2B shows a schematic cross-sectional view of part of a single pixel 202 of FIG. 2A comprising a silicon substrate 212, a silicon oxide layer 214, and contact and interconnect metal structures 216. Oxide layer 214 is deposited onto substrate 212 and is typically a few microns thick, with metal structures 216 formed within layer 214. Representative structures (e.g., various p and n doped regions) for photoelement 204 and for a MOSFET transistor 218 of associated circuitry 206 of pixel 202 are shown in FIG. 2B as well. Filter 209 is attached to layer 214. Microlens 208 is placed over filter 209 and positioned to have its focal point inside photoelement 204.

The fraction of the layout area of each pixel that detects light is called the optical fill factor. The fill factor is less than 100% because some of the pixel area is used by other circuitry, such as associated circuitry 206 of FIG. 2A. Microlens 208 concentrates the incoming light onto photoelement 204 thereby improving the fill factor and consequently the sensitivity of image sensor 100. The area above photoelement 204 is substantially free of interconnect metal structures 216 to improve the quantum efficiency of the pixel (defined as the ratio of the number of collected photoelectrons (or photo-holes) to the number of incident photons). Greater quantum efficiency also improves the sensitivity of image sensor 100.

Image sensors such as image sensor 100 of FIG. 1 are prone to image degradation due to several sources of noise and/or spurious signals. One problem is charge leakage from photoelement 204, schematically represented in FIG. 2B by arrow 250. Due to the doping profiles of the edges of the photoelement, its periphery has a disproportionately large capacitance and electrical field. Charge stored in this area of the photoelement is susceptible to leakage into the bulk of the silicon substrate. One other problem associated with the periphery of the photoelement is capture by the photoelement of spurious photocurrent generated by light incident on associated circuitry 206, schematically represented in FIG. 2B by arrow 260. Charge leakage out of or into the photoelement can introduce errors into the electrical signal generated by the pixel and degrade the quality of the image captured by the image sensor.

One additional problem inherent to the image sensor stricture of FIG. 2B is blooming. Blooming is an overflow of charge from an oversaturated pixel to an adjacent pixel in the pixel array. Because each photoelement has a limit as to how much charge it can store, extra photogenerated charge may flow from the photoelement into the substrate, migrate to the pixel boundary, and transfer to an adjacent pixel where it may eventually be captured by the unsaturated photoelement in that pixel. This process is schematically represented in FIG. 2B by arrow 270. In particular, blooming is a problem for high contrast images (e.g., a very bright edge against a virtually black background) and is typically visible as either a vertical streak or white halo extending for several pixels.

One more problem with the image sensor structure of FIG. 2B is optical crosstalk. One way for the optical crosstalk to be introduced is when light enters a pixel through a color filter of an adjacent pixel (such as filter 209' of FIG. 2B) and strikes the photoelement (such as photoelement 204 of FIG. 2B). This can result in the loss of color purity in an image. A different way for the optical crosstalk to occur is when light incident at one pixel is deflected or scattered and eventually captured by another pixel. Multiple reflections off of interconnect metal structures (such as metal structures 216 of FIG. 2B), various interfaces, and microlenses and waveguide properties of the oxide layer are largely responsible for this type of the optical crosstalk. Sample optical paths contributing to the optical crosstalk are schematically shown by certain thin arrows in FIG. 2B.

Optical and electrical noise and spurious signals degrade image quality and create artifacts in the image sensor's output.

SUMMARY OF THE INVENTION

Embodiments of the present invention are directed to techniques for reducing noise and spurious signals in integrated image sensors by which at least some of the optical and/or electrical pathways responsible for generating the same are either inhibited or eliminated. Reduction of optical and/or electrical noise and of spurious signals improves image quality and helps to eliminate artifacts in the image sensor's output. It also boosts the image sensor's performance in low-light imaging applications where improved signal-to-noise ratio allows for longer exposure times.

According to one embodiment, the present invention is an integrated circuit having an image sensor, wherein the image sensor has an array of one or more pixels, wherein at least one pixel in the array comprises (a) a photoelement formed on a substrate and configured to generate an electrical signal in response to incident light; and (b) associated circuitry formed on the substrate and configured to process the electrical signal generated in the photoelement. At least part of the photoelement and at least part of the associated circuitry are formed within a common insulating layer formed on the substrate, wherein a portion of the common insulating layer corresponding to the photoelement has a thickness different from a thickness of a portion of the common insulating layer corresponding to the associated circuitry.

According to another embodiment, the present invention is an integrated circuit having a digital image sensor, wherein the digital image sensor has an array of one or more digital pixels, wherein at least one digital pixel in the array comprises (a) a photoelement formed on a substrate and configured to generate a digital electrical signal in response to incident light; (b) associated circuitry formed on the substrate and configured to process the digital electrical signal generated in the photoelement; and (c) one or more insulating structures formed on the substrate and configured to inhibit flow of electricity between at least one of (1) the photoelement and the associated circuitry and (2) the pixel and an adjacent pixel in the array.

BRIEF DESCRIPTION OF THE DRAWINGS

Other aspects, features, and advantages of the present invention will become more fully apparent from the following detailed description, the appended claims, and the accompanying drawings in which:

FIGS. 3A–B show schematic top and cross-sectional views of part of an integrated CMOS image sensor according to one embodiment of the present invention;

FIGS. 5A–B show schematic top and cross-sectional views of part of an integrated CMOS image sensor according to another embodiment of the present invention.

DETAILED DESCRIPTION

Figure 1:
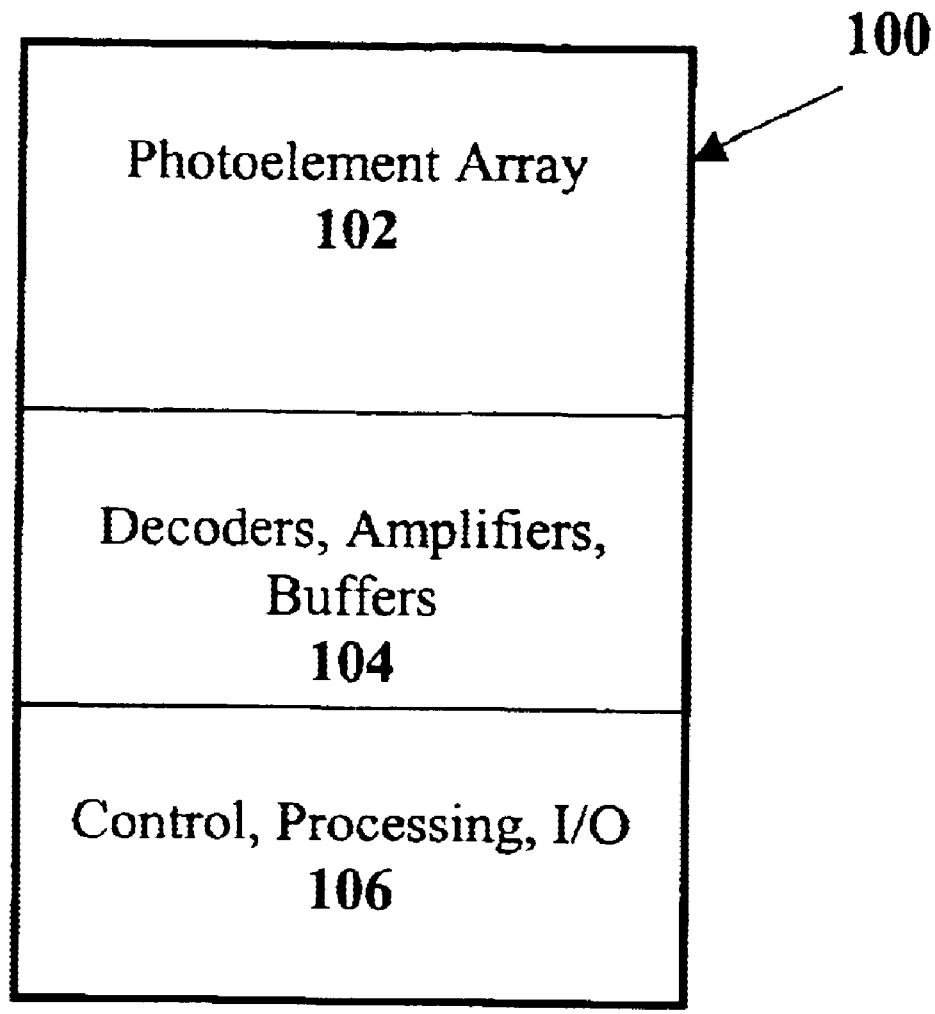
FIG. 1 shows a schematic top view of an integrated CMOS image sensor of the prior art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. The description herein is largely based on a particular image sensor based on CMOS pixel sensor architecture. Those skilled in the art can appreciate that the description can be equally applied to other image sensors, including those based on other silicon or even non-silicon technologies.

According to one aspect of the present invention, one or more additional oxide layers are introduced into the silicon substrate of an image sensor to reduce or eliminate the electrical pathways for noise and crosstalk propagation across the image sensor. According to another aspect of the present invention, the top silicon oxide layer of an image sensor is conditioned to reduce or eliminate the optical pathways for noise and crosstalk propagation across the image sensor. Although the present invention is described in the framework of these electrical and optical implementations, it will be understood from the following description and the appended claims that the present invention can also be implemented using various combinations thereof. The following four sections provide descriptions of just four of the possible embodiments of the present invention.

A. Silicon on Insulator

FIG. 3A shows a schematic top view of part of a photoelement array 300 of an integrated CMOS image sensor according to one embodiment of the present invention. Photoelement array 300 comprises an array of individual pixels 302 (a representative 2×2 region is shown). Each pixel 302 comprises a photoelement 304, its associated circuitry 306, and an optional microlens 308. Individual pixels are separated by pixel boundaries 310.

FIG. 3B shows a schematic cross-sectional view of part of a single pixel 302 of FIG. 3A comprising a supporting substrate 330, an insulating (e.g., oxide) layer 332, a silicon layer 334 (with various n and p doped regions), lateral insulating structures 336 and 338, a top insulating (e.g., silicon oxide) layer 314, and contact and interconnect metal structures 316, forming photoelement 304 and its associated circuitry 306. Insulating layer 332 is formed between substrate 330 and layer 334. Because silicon layer 334 resides on insulating layer 332, the tern silicon-on-insulator (SOI) is adopted to refer to this type of configuration. Lateral insulating structures 336 and 338 are introduced into silicon layer 334 at pixel boundary 310 and at the periphery of photoelement 304, respectively. Depending on the implementation, lateral insulating structures 336 and 338 may be oxide structures or they may just be empty space providing electrical insulation between existing structures. Insulating layer 314 is deposited over silicon layer 334 with metal structures 316 formed within layer 314. Microlens 308 is attached to layer 314 and positioned to have its focal point inside photoelement 304.

The use of buried oxide layer 332 and lateral insulating structures 338 can substantially reduce the periphery component of the capacitance of photoelement 304. For example, in an embodiment where photoelement 304 is a photodiode, the periphery component of capacitance can be reduced by 80–90% with a corresponding reduction in current leakage 250 of FIG. 2B and/or in capture of spurious photoelectric current 260 of FIG. 2B. The use of layer 332 and structures 338 can also substantially reduce the overall capacitance of photoelement 304 resulting in higher light sensitivity for individual pixels 302 and photoelement array 300.

Similarly, lateral insulating structure 336 deposited at pixel boundary 310 can substantially reduce electrical contact between neighboring pixels. Since the resulting photoelements are effectively configured in separate, electrically isolated substrates, the electrical crosstalk between pixels is significantly reduced. In particular, blooming due to current 270 of FIG. 2B can be significantly reduced.

Figures 2A, 2B:
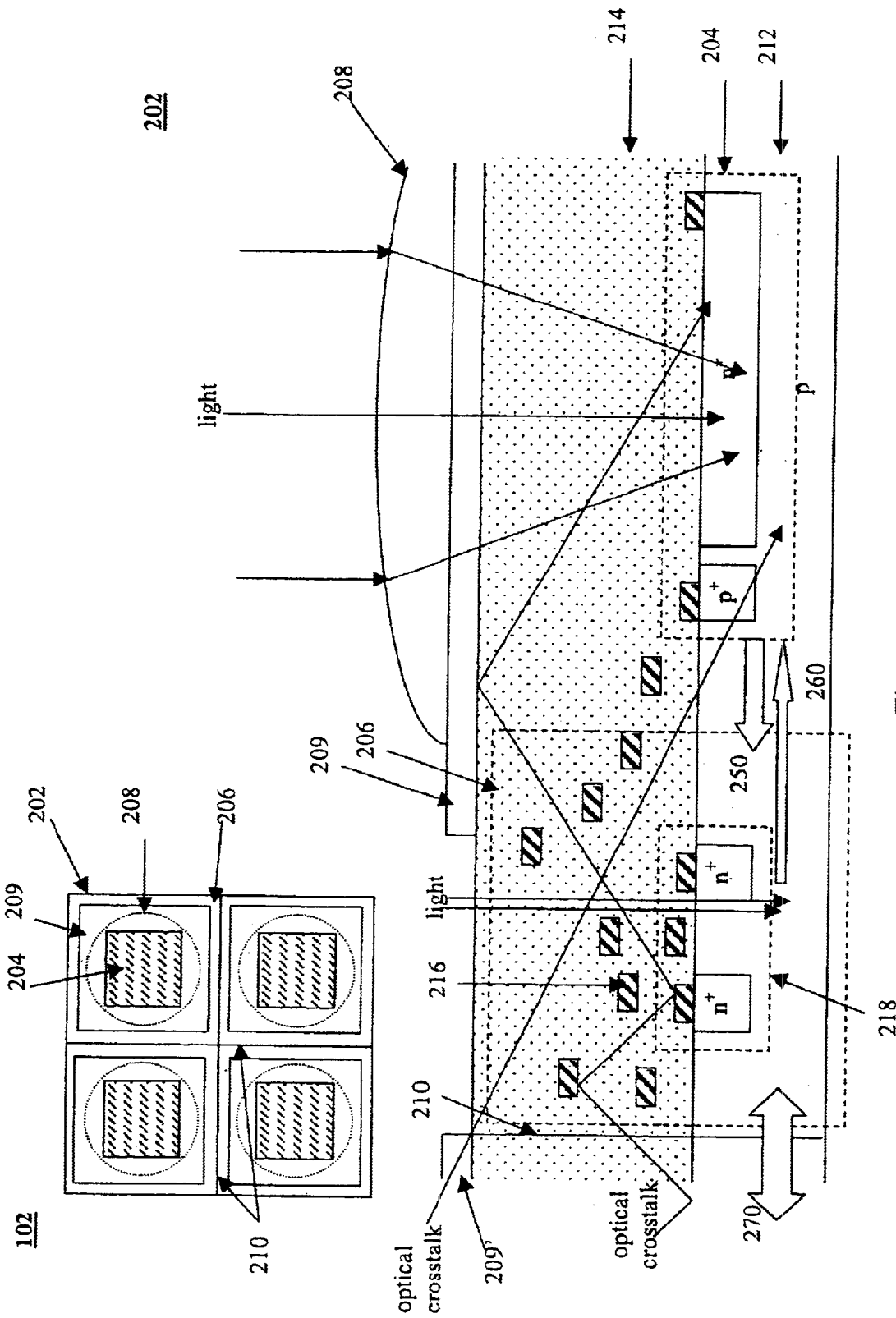
FIGS. 2A–B show schematic top and cross-sectional views of part of the integrated CMOS image sensor of FIG. 1.

Advantages of SOI features of the present invention, such as those shown in FIG. 2B, are as follows:

(a) Higher image quality for a CMOS image sensor due to lower electrical noise and the reduction of blooming;

(b) Increased sensitivity for a CMOS image sensor due to the reduction in the capacitance of photoelements; and (c) Better performance for a CMOS image sensor in low-light imaging applications due to better signal-to-noise ratio and the availability of longer exposure times.

B. Mask over Associated Circuitry

Figure 4A:
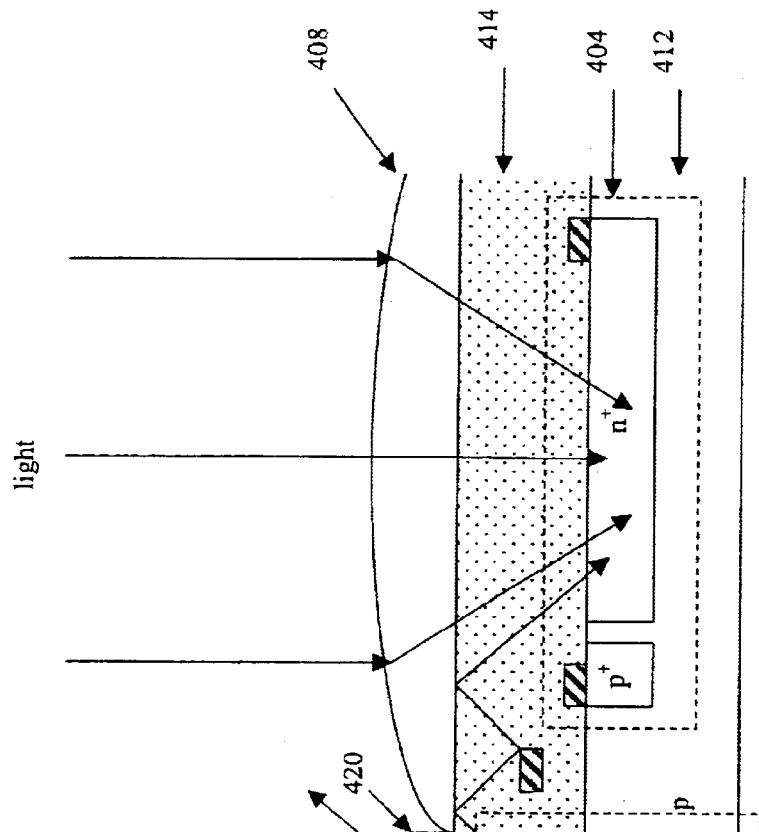
FIGS. 4A–B show schematic top and cross-sectional views of part of an integrated CMOS image sensor according to an alternative embodiment of the present invention.

FIG. 4A shows a schematic top view of part of a photoelement array 400 of an integrated CMOS image sensor according to an alternative embodiment of the present invention. Photoelement array 400 comprises an array of individual pixels 402 (a representative 2×2 region is shown). Pixel 402 comprises a photoelement 404, a mask layer 420, associated circuitry 406 (not visible in FIG. 4A under mask layer 420), and an optional microlens 408. Individual pixels are separated by pixel boundaries 410.

Figure 4B:
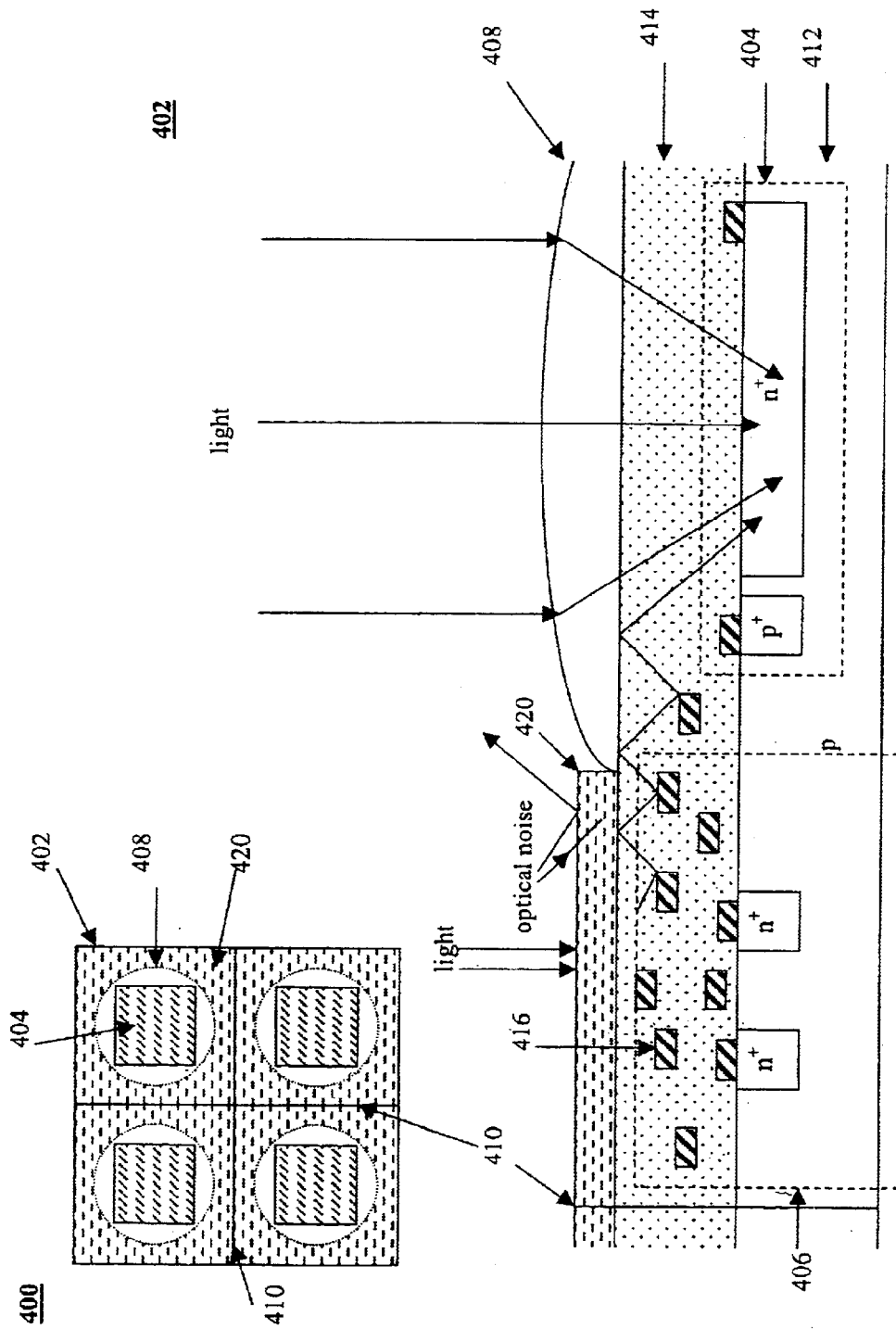

FIG. 4B shows a schematic cross-sectional view of part of a single pixel 402 of FIG. 4A comprising a silicon substrate 412 (with various n and p doped regions), an insulating (e.g., silicon oxide) layer 414, contact and interconnect metal structures 416, and mask layer 420, which form photoelement 404 and its associated circuitry 406. Insulating layer 414 is deposited onto substrate 412 with metal structures 416 formed within layer 414. Microlens 408 is attached to layer 414 and positioned to have its focal point inside photoelement 404. Mask layer 420 is deposited to cover at least a portion of the area above associated circuitry 406. Layer 420 can be made of any material that either attenuates or blocks the transmission of light capable of producing photogenerated charge either in associated circuitry 406 or photoelement 404. For example, layer 420 can be a metal film or an opaque polymer layer.

Mask layer 420 inhibits light impinging on pixel 402 from entering silicon substrate 412 through the covered area above associated circuitry 406, thus, reducing the electrical noise component due to spurious photocurrent 260 of FIG. B. Layer 420 may also reduce the optical noise of photoelement array 400 by either absorbing or rejecting at least a portion of stray light responsible for optical noise.

C. Top Oxide Layer of Variable Thickness

FIG. 5A shows a schematic top view of part of a photoelement array 500 of an integrated CMOS image sensor according to another embodiment of the present invention. Photoelement array 500 comprises an array of individual pixels 502 (a representative 2×2 region is shown). Pixel 502 comprises a photoelement 504, associated circuitry 506, an optional microlens 508, and an optional color filter 509. Individual pixels are separated by pixel boundaries 510.

FIG. 5B shows a schematic cross-sectional view of part of a single pixel 502 of FIG. 5A comprising a silicon substrate 512 (with various n and p doped regions), an insulating (e.g., silicon oxide) layer 514, contact and interconnect metal structures 516, which form photoelement 504 and its associated circuitry 506. Insulating layer 514 is deposited onto substrate 512 with metal structures 516 formed within layer 514. Color filter 509 is attached to layer 514. Microlens 508 is placed over filter 509 and positioned to have its focal point inside photoelement 504.

Insulating layer 514 comprises at least two sections having different thickness, e.g. a thicker section 522 and a thinner section 524. Thicker section 522 of layer 514 corresponds to at least a first portion of associated circuitry 506 to provide electrical insulation for interconnect metal structures 516 located within associated circuitry 506. Thinner section 524 of layer 514 corresponds to photoelement 504 and possibly a second portion of associated circuitry 506. In the example shown in FIG. 5B, the transition from thicker section 522 to thinner section 524 occurs within associated circuitry 506. In alternative implementations, the transition can occur at the boundary between associated circuitry 506 and photoelement 504, or even possibly within photoelement 504.

Section 524 of layer 514 can be thinner than section 522, because photoelement 504 typically has fewer interconnect metal structures 516 than associated circuitry 506. During fabrication, thinner section 524 can be formed by removing excess oxide from above photoelement 504, for example, by etching. Section 524 of layer 514 can accommodate microlens 508 and filter 509 as shown in FIG. 5B.

Having thinner insulating layer section 524 over photoelement 504 reduces the distance between microlens 508/filter 509 and photoelement 504. This results in a larger solid angle of light acceptance through microlens 508/filter 509 for photoelement 504. Consequently, the angle of acceptance is reduced for the optical crosstalk caused by light that enters a pixel through a color filter of an adjacent pixel (such as filter 209' of FIG. 2B or filter 509' of FIG. 5B) and strikes the photoelement (such as photoelement 204 of FIG. 2B or photoelement 504 of FIG. 5B). As a result, fewer optical crosstalk photons impinge on the photoelement, thus, reducing the optical crosstalk.

In addition, reducing the thickness of the insulating layer above the photoelement in a pixel may increase the sensitivity of the pixel by reducing the amount of absorption of light as it passes through the insulating layer towards the photoelement.

Oxide layers such as layer 214 of FIG. 2B may also facilitate optical crosstalk by channeling light from pixel to pixel due to the well-known waveguide effect, similar to that in optical fibers, and also, due to multiple reflections from inserted metal structures, such as interconnect metal structures 216 of FIG. 2B. Having oxide layer sections of differing thickness, such as sections 522 and 524 of layer 514 of FIG. 5B, introduces an optical mismatch between the sections. A thinner section of the oxide layer, such as section 524 of layer 514, will have both a smaller cross-sectional acceptance area and a smaller cross-sectional acceptance angle, thereby preventing at least a portion of stray light propagating in a thicker section of the oxide layer, such as section 522 of layer 514, from entering the thinner section and, thus, from reaching the photoelement As a result, optical crosstalk is reduced due to fewer stray photons impinging on the photoelement.

D. Silicon on Insulator Chip with Conditioned Top Oxide Layer

Figure 6A:
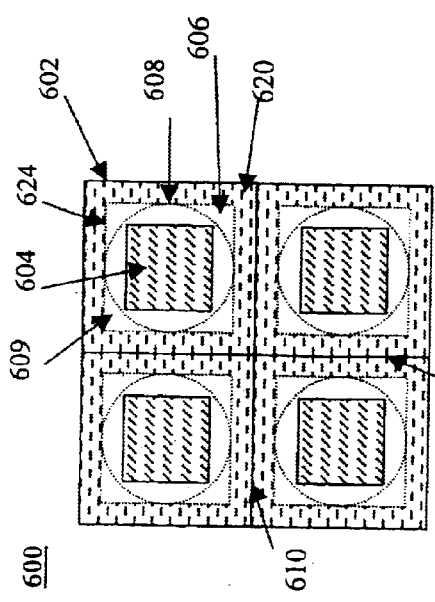
FIGS. 6A–B show schematic top and cross-sectional views of part of an integrated CMOS image sensor according to yet another embodiment of the present invention.
Figure 6B:
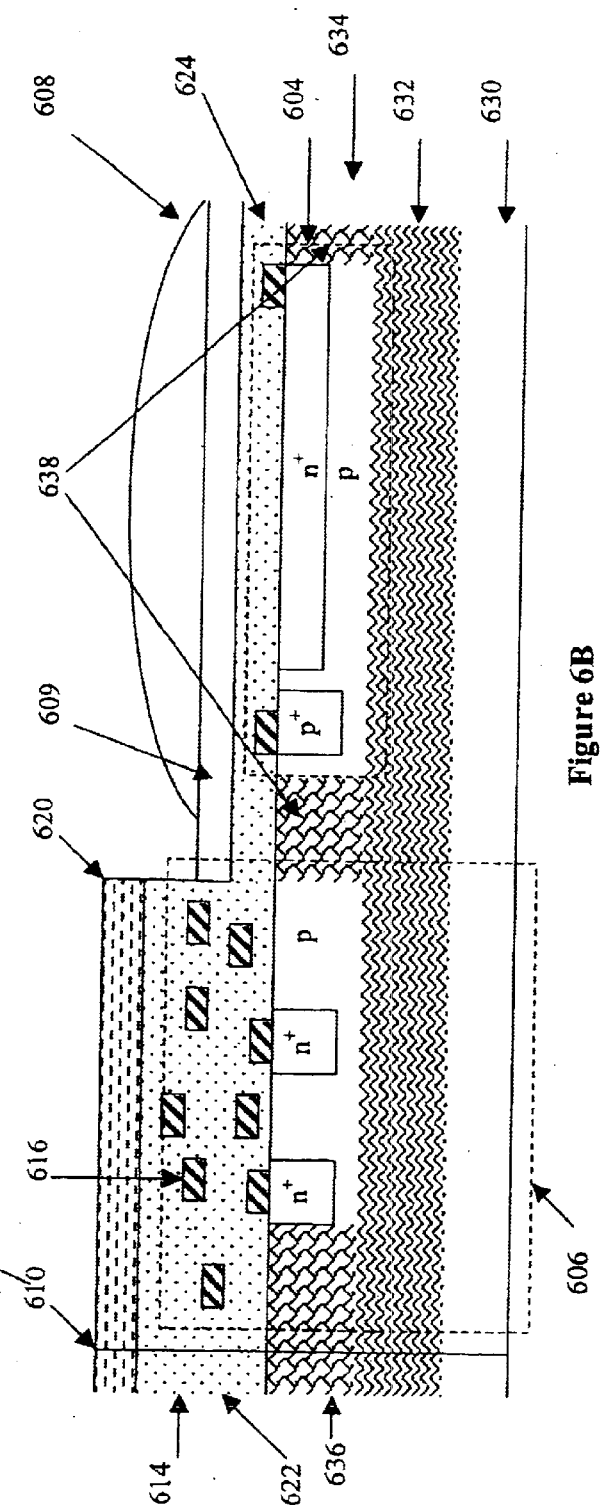

FIGS. 6A–B show an embodiment of the present invention that incorporates SOI configurations, similar to those of photoelement array 300 of FIGS. 3A–B, a mask layer similar to that of photoelement array 400 of FIGS. 4A–B, and a silicon oxide layer with variable thickness similar to that of photoelement array 500 of FIGS. 5A–B. As such, FIGS. 6A–B show one possible combination of the features described previously in Sections A, B, and C.

In particular, FIG. 6A shows a schematic top view of part of a photoelement array 600 of an integrated CMOS image sensor according to yet another embodiment of the present invention. Photoelement array 600 comprises an array of individual pixels 602 (a representative 2×2 region is shown). Pixel 602 comprises a photoelement 604, a mask layer 620, associated circuitry 606, an optional microlens 608, and an optional color filter 609. Individual pixels are separated by pixel boundaries 610.

FIG. 6B shows a schematic cross-sectional view of part of a single pixel 602 of FIG. 6A comprising a supporting substrate 630, an oxide layer 632, a silicon layer 634, lateral insulating structures 636 and 638, a top oxide layer 614, mask layer 620, and contact and interconnect metal structures 616, which form photoelement 604 and its associated circuitry 606. Substrate 630, oxide layer 632, silicon layer 634, and lateral insulating structures 636 and 638 are analogous to substrate 330, oxide layer 332, silicon layer 334, and lateral insulating structures 336 and 338 of FIG. 3, respectively. Mask layer 620 is analogous to mask layer 420 of FIG. 4. Top oxide layer 614 is analogous to top oxide layer 514 of FIG. 5. As such, the embodiment of FIGS. 6A–B reduces or eliminates both the electrical and optical components of noise and crosstalk described previously in the context of Sections A, B, and C.

In general, the present invention may be implemented for image sensors having one or more photoelements arranged in either a one- or two-dimensional pattern, such as an array of elements arranged in rows and columns. The individual pixels within a given sensor can be square, rectangular, or any other shapes forming a close-packed pattern. The individual photoelements and/or pixels within a given sensor array as well as associated circuitry may be the same or different. Although the present invention has been described in the context of CMOS technology for image sensors, it will be understood that the present invention can be implemented using other technologies, such as nMOS, pMOS, or other non-MOS technologies. The substrates used in the image sensors of the present invention may be made of any suitable semiconductor material, such as Si, GaAs, or InP, with wells of different dopant types to form various structures. Each photoelement may be based on any suitable light-sensitive device, such as, for example, a photodiode, a phototransistor, a photogate, photo-conductor, a charge-coupled device, a charge-transfer device, or a charge-injection device. Similarly, as used in this specification, the term "light" refers to any suitable electromagnetic radiation in any wavelength and is not necessarily limited to visible light. Image sensors of the present invention may be implemented with or without microlenses. The sensors may also have color filter arrays to discriminate between different energies of the electromagnetic spectrum.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the principle and scope of the invention as expressed in the following claims. Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. An integrated circuit having an image sensor, wherein the image sensor has an array of one or more pixels, wherein at least one pixel in the array comprises:
   (a) a photoelement formed on a substrate and configured to generate an electrical signal in response to incident light;
   (b) associated circuitry formed on the substrate and configured to process the electrical signal generated in the photoelement; and
   (c) two or more insulator structures formed on the substrate and configured to inhibit flow of electricity between at least one of (1) the photoelement and the associated circuitry and (2) the pixel and an adjacent pixel in the array, wherein the two or more insulator structures comprise:
      (i) an insulator layer between the substrate and at least one of (1) the photoelement and (2) the associated circuitry; and
      (ii) at least one lateral insulator structure between at least one of (1) the photoelement and the associated circuitry and (2) the pixel and the adjacent pixel, wherein the at least one lateral insulator structure is in direct physical contact with the insulator layer to form a contiguous electrical isolation barrier, wherein:
      at least part of the photoelement and at least part of the associated circuitry are formed within a common insulator layer formed on the substrate, wherein a portion of the common insulator layer corresponding to the photoelement has a thickness different from a thickness of a portion of the common insulator layer corresponding to the associated circuitry.

2. The invention of claim 1, wherein:
the at least one lateral insulator structure is between the photoelement and the associated circuitry; and
the contiguous electrical isolation barrier inhibits the flow of electricity between the photoelement and the associated circuitry.

3. The invention of claim 2, wherein the insulator layer is between the substrate and both the photoelement and the associated circuitry.

4. The invention of claim 1, wherein:
the at least one lateral insulator structure is between the pixel and the adjacent pixel; and
the contiguous electrical isolation barrier inhibits the flow of electricity between the pixel and the adjacent pixel.

5. The invention of claim 4, wherein the insulator layer is between the substrate and both the photoelement and the associated circuitry.

6. The invention of claim 4, wherein the one or more insulator structures further comprises a second lateral insulator structure between the photoelement and the associated circuitry and in direct physical contact with the insulator layer, wherein the contiguous electrical isolation barrier further inhibits the flow of electricity between the photoelement and the associated circuitry.

7. The invention of claim 6, wherein the insulator layer is between the substrate and both the photoelement and the associated circuitry.

8. The invention of claim 7, wherein:
the pixel further comprises a mask layer formed on top of at least some of the associated circuitry, wherein the mask layer inhibits light incident at the associated circuitry from contributing to the electrical signal at the photoelement; and
the portion of the common insulator layer corresponding to the associated circuitry is thicker than the portion of the common insulator layer corresponding to the photoelement.

9. The invention of claim 8, wherein:
the image sensor is a CMOS image sensor;
the one or more insulator structures comprise an oxide of silicon;
the pixel further comprises a microlens positioned over the photoelement; and
the photoelement is a photodiode, a phototransistor, a photogate, photo-conductor, a charge-coupled device, a charge-transfer device, or a charge-injection device.

10. The invention of claim 1, wherein:
the image sensor is a CMOS image sensor;
the one or more insulator structures comprise an oxide of silicon;
the pixel further comprises a microlens positioned over the photoelement; and the photoelement is a photodiode, a phototransistor, a photogate, photo-conductor, a charge-coupled device, a charge-transfer device, or a charge-injection device.

11. The invention of claim 1, wherein the pixel further comprises a mask layer formed on top of at least some of the associated circuitry, wherein the mask layer inhibits light incident at the associated circuitry from contributing to the electrical signal at the photoelement.

12. The invention of claim 1, wherein the portion of the common insulator layer corresponding to the associated circuitry is thicker than the portion of the common insulator layer corresponding to the photoelement.

13. A method for fabricating an integrated circuit having an image sensor, wherein the image sensor has an array of one or more pixels, the method comprises, for at least one pixel in the array, the steps of:
  (a) forming a photoelement formed on a substrate and configured to generate an electrical signal in response to incident light;
  (b) forming associated circuitry formed on the substrate and configured to process the electrical signal generated in the photoelement; and
  (c) forming two or more insulator structures formed on the substrate and configured to inhibit flow of electricity between at least one of (1) the photoelement and the associated circuitry and (2) the pixel and an adjacent pixel in the array, wherein the two or more insulator structures comprise:
    (i) an insulator layer between the substrate and at least one of (1) the photoelement and (2) the associated circuitry; and
    (ii) at least one lateral insulator structure between at least one of (1) the photoelement and the associated circuitry and (2) the pixel and the adjacent pixel, wherein the at least one lateral insulator structure is in direct physical contact with the insulator layer to form a contiguous electrical isolation barrier, wherein:
      at least part of the photoelement and at least part of the associated circuitry are formed within a common insulator layer formed on the substrate, wherein a portion of the common insulator layer corresponding to the photoelement has a thickness different from a thickness of a portion of the common insulator layer corresponding to the associated circuitry.

14. The invention of claim 13, wherein:
the at least one lateral insulator structure is between the photoelement and the associated circuitry; and
the contiguous electrical isolation barrier inhibits the flow of electricity between the photoelement and the associated circuitry.

15. The invention of claim 14, wherein the insulator layer is between the substrate and both the photoelement and the associated circuitry.

16. The invention of claim 13, wherein:
the at least one lateral insulator structure is between the pixel and the adjacent pixel; and
the contiguous electrical isolation barrier inhibits the flow of electricity between the pixel and the adjacent pixel.

17. The invention of claim 16, wherein the insulator layer is between the substrate and both the photoelement and the associated circuitry.

18. The invention of claim 16, wherein the one or more insulator structures further comprises a second lateral insulator structure between the photoelement and the associated circuitry and in direct physical contact with the insulator layer, wherein the contiguous electrical isolation barrier further inhibits the flow of electricity between the photoelement and the associated circuitry.

19. The invention of claim 18, wherein the insulator layer is between the substrate and both the photoelement and the associated circuitry.

20. The invention of claim 19, wherein:
the pixel further comprises a mask layer formed on top of at least some of the associated circuitry, wherein the mask layer inhibits light incident at the associated circuitry from contributing to the electrical signal at the photoelement; and
the portion of the common insulator layer corresponding to the associated circuitry is thicker than the portion of the common insulator layer corresponding to the photoelement.

21. The invention of claim 20, wherein:
the image sensor is a CMOS image sensor;
the one or more insulator structures comprise an oxide of silicon;
the pixel further comprises a microlens positioned over the photoelement; and
the photoelement is a photodiode, a phototransistor, a photogate, photo-conductor, a charge-coupled device, a charge-transfer device, or a charge-injection device.

22. The invention of claim 13, wherein:
the image sensor is a CMOS image sensor;
the one or more insulator structures comprise an oxide of silicon;
the pixel further comprises a microlens positioned over the photoelement; and
the photoelement is a photodiode, a phototransistor, a photogate, photo-conductor, a charge-coupled device, a charge-transfer device, or a charge-injection device.

23. The invention of claim 13, wherein the pixel further comprises a mask layer formed on top of at least some of the associated circuitry, wherein the mask layer inhibits light incident at the associated circuitry from contributing to the electrical signal at the photoelement.

24. The invention of claim 13, wherein the portion of the common insulator layer corresponding to the associated circuitry is thicker than the portion of the common insulator layer corresponding to the photoelement.

* * * * *